United States Patent
Ham et al.

(10) Patent No.: US 8,159,641 B2
(45) Date of Patent: Apr. 17, 2012

(54) ARRAY SUBSTRATE HAVING COMMON ELECTRODE WITH SLITS THAT OVERLAP DATA LINES, AND LIQUID CRYSTAL DISPLAY APPARATUS HAVING THE ARRAY SUBSTRATE

(75) Inventors: Yeon-Sik Ham, Suwon-si (KR); Yeon-Mun Jeon, Iksan-si (KR); Yong-Koo Her, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 288 days.

(21) Appl. No.: 12/417,362

(22) Filed: Apr. 2, 2009

(65) Prior Publication Data
US 2010/0007837 A1    Jan. 14, 2010

(30) Foreign Application Priority Data
Jul. 8, 2008 (KR) .................. 10-2008-0065978

(51) Int. Cl.
*G02F 1/1343* (2006.01)
(52) U.S. Cl. ........................... 349/139; 349/143
(58) Field of Classification Search ............ None
See application file for complete search history.

(56) References Cited

U.S. PATENT DOCUMENTS

| | | | | |
|---|---|---|---|---|
| 6,069,678 A | * | 5/2000 | Sakamoto et al. | 349/141 |
| 2002/0131003 A1 | * | 9/2002 | Matsumoto | 349/139 |
| 2004/0169808 A1 | * | 9/2004 | Shih et al. | 349/141 |
| 2004/0227888 A1 | * | 11/2004 | Tak et al. | 349/139 |
| 2007/0052899 A1 | * | 3/2007 | Lin et al. | 349/141 |
| 2007/0279487 A1 | * | 12/2007 | Oke et al. | 348/87 |
| 2008/0186440 A1 | * | 8/2008 | Lim et al. | 349/141 |
| 2009/0066901 A1 | * | 3/2009 | Lin et al. | 349/139 |
| 2009/0147168 A1 | * | 6/2009 | Lu et al. | 349/43 |
| 2009/0160748 A1 | * | 6/2009 | Kimura et al. | 345/94 |

FOREIGN PATENT DOCUMENTS

| | | |
|---|---|---|
| JP | 2007-249100 | 9/2007 |
| KR | 10-2004-0035123 | 4/2004 |
| KR | 10-2007-0063127 | 6/2007 |

* cited by examiner

*Primary Examiner* — Mike Stahl
(74) *Attorney, Agent, or Firm* — H.C. Park & Associates, PLC

(57) ABSTRACT

An array substrate includes a substrate, a switching element, a pixel electrode, and a common electrode. The substrate includes a plurality of gate lines, data lines insulated from the gate lines, and the data lines extend in a direction crossing the gate lines. The switching element is connected to the gate lines and data lines. The pixel electrode is arranged in a pixel area which is defined on the substrate, and is connected to an output electrode of the switching element. The common electrode corresponds to the pixel area and is insulated from the pixel electrode, and the common electrode has at least one first slit corresponding to the data line.

23 Claims, 13 Drawing Sheets

US 8,159,641 B2

ARRAY SUBSTRATE HAVING COMMON ELECTRODE WITH SLITS THAT OVERLAP DATA LINES, AND LIQUID CRYSTAL DISPLAY APPARATUS HAVING THE ARRAY SUBSTRATE

CROSS REFERENCE TO RELATED APPLICATION

This application claims priority from and the benefit of Korean Patent Application No. 2008-65978, filed on Jul. 8, 2008, which is hereby incorporated by reference for all purposes as if fully set forth herein.

BACKGROUND OF THE INVENTION

1. Field of the Invention

The present invention relates to an array substrate and a liquid crystal display (LCD) apparatus having the same. More particularly, the present invention relates to an array substrate and an LCD apparatus having the same and employed as a substrate of an LCD panel.

2. Discussion of the Background

Generally, a liquid crystal display (LCD) device, which is one of the most widely used types of flat panel display devices, includes two display substrates in which an electric field generating electrodes are formed, and a liquid crystal layer is interposed between the two display substrates. An electric field is generated in the liquid crystal layer by applying a voltage to the electric field generating electrodes. The alignment of liquid crystal molecules in the liquid crystal layer is determined by the electric field. An image is displayed by controlling the polarization of incident light, which occurs because of the alignment of the liquid crystal molecules.

A vertical alignment (VA) mode LCD apparatus in which the major axes of the liquid crystal molecules are aligned substantially perpendicular to the upper and lower substrates has been widely used because of a high contrast ratio.

However, a patterned vertical alignment (PVA) mode LCD apparatus, which has an incision part that is not used for the VA mode LCD apparatus, an in-plane switching (IPS) mode LCD apparatus, a plane-to-line switching (PLS) LCD apparatus, and a fringe-field switching (FFS) mode LCD apparatus have been developed to improve viewing angles.

LCD apparatuses such as the above have been developed to increase aperture ratios, decrease driving voltages, and decrease parasitic capacitances between signal lines and electric field generating electrodes.

SUMMARY ON THE INVENTION

The present invention provides an array substrate capable of enhancing image quality by reducing signal distortion.

The present invention also provides a liquid crystal display (LCD) apparatus having the array substrate.

Additional features of the invention will be set forth in the description which follows, and in part will be apparent from the description, or may be learned by practice of the invention.

The present invention discloses an array substrate including a substrate, a switching element, a pixel electrode, and a common electrode. Gate lines and data lines are arranged on the substrate, and the data lines, which are insulated from the gate lines, extend in a direction crossing the gate lines. The switching element is connected to the gate lines and the data lines. The pixel electrode is arranged in a pixel area defined on the substrate, and is connected to an output electrode of the switching element. The common electrode, which is insulated from the pixel electrode, is arranged on the substrate corresponding to the pixel area. At least one first slit is formed in the common electrode corresponding to the data line.

The present invention also discloses an LCD apparatus which includes an array substrate, an opposite substrate, and a liquid crystal layer. The array substrate includes a lower substrate, a switching element, a pixel electrode, and a common electrode. Gate lines and data lines are arranged on the lower substrate, and the data lines, which are insulated from the gate lines, extend in a direction crossing the gate lines. The switching element is connected to the gate lines and the data lines. The pixel electrode is arranged in a pixel area defined on the substrate, and is connected to an output electrode of the switching element. The common electrode, which is insulated from the pixel electrode, is arranged on the substrate where at least one data line is arranged corresponding to the pixel area. At least one first slit is arranged in the common electrode corresponding to the data line. A liquid crystal layer is interposed between the array substrate and an opposite substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
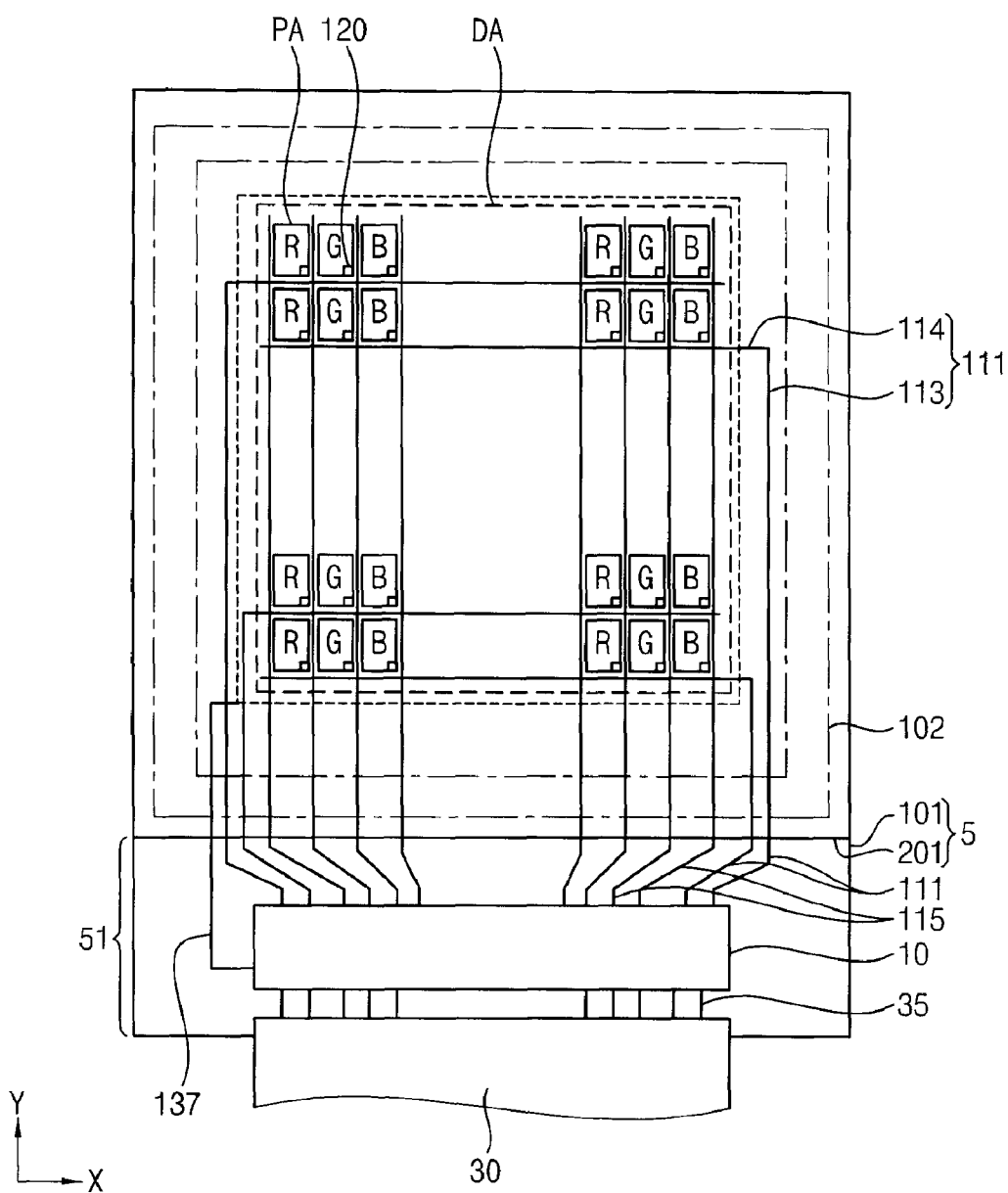
FIG. 1 is a plan view showing a display apparatus in accordance with a first exemplary embodiment of the present invention.

The present invention is described more fully hereinafter with reference to the accompanying drawings, in which exemplary embodiments of the present invention are shown.

The present invention may, however, be embodied in many different forms and should not be construed as limited to the exemplary embodiments set forth herein. Rather, these embodiments are provided so that this disclosure is thorough and complete, and will fully convey the scope of the present invention to those skilled in the art. In the drawings, the sizes and relative sizes of layers and regions may be exaggerated for clarity. Like reference numerals in the drawings denote like elements.

It will be understood that when an element or layer is referring to as being "on," "connected to" or "coupled to" another element or layer, it can be directly on, connected or coupled to the other element or layer or intervening elements or layers may be present. In contrast, when an element is referring to as being "directly on," "directly connected to" or "directly coupled to" another element or layer, there are no intervening elements or layers present.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-sectional illustrations that are schematic illustrations of idealized exemplary embodiments (and intermediate structures) of the present invention. As such, variations from the shapes of the illustrations as a result, for example, of manufacturing techniques and/or tolerances, are to be expected. Thus, exemplary embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a plan view showing a liquid crystal display (LCD) apparatus in accordance with a first exemplary embodiment of the present invention.

Referring to FIG. 1, an LCD device 100 includes a display panel 5 and a driving part 10.

The display panel 5 includes an array substrate 101, an opposite substrate 201, and a liquid crystal layer. The array substrate 101 and the opposite substrate 201 face each other and are sealed by a sealing material 102 of a frame shape, and liquid crystal is encapsulated on the inner side of the sealing material 102, the array substrate 101, and the opposite substrate 201 to form the liquid crystal layer.

In FIG. 1, the opposite substrate 201 is disposed in front of the array substrate 101.

The opposite substrate 201 may be a color filter substrate having R, G, and B color filters. The array substrate 101 is a device substrate which is driven by an active matrix driving method using a thin-film transistor (TFT).

Figure 2:
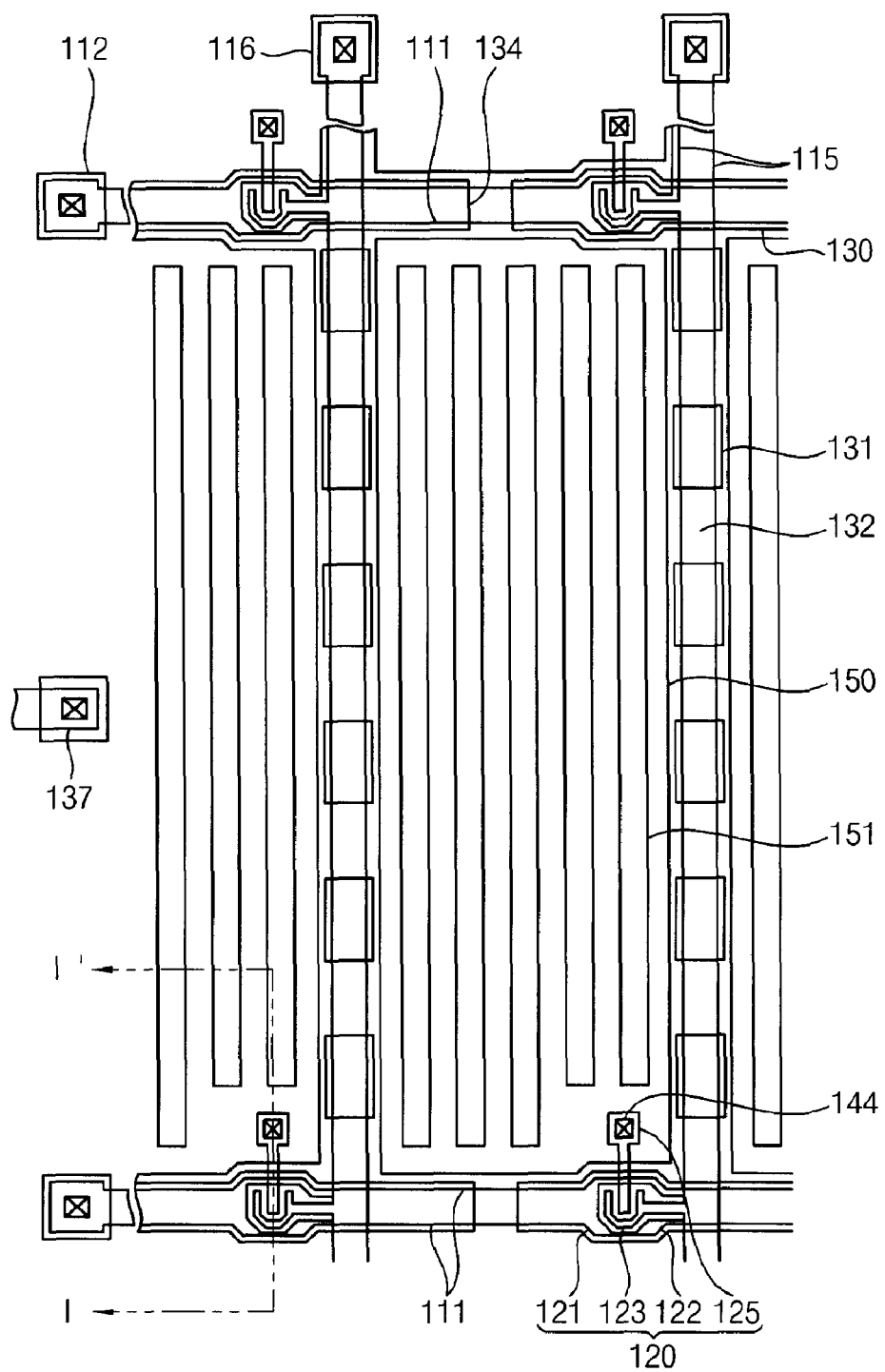
FIG. 2 is an enlarged plan view showing a pixel of the display apparatus in FIG. 1.
Figure 3:
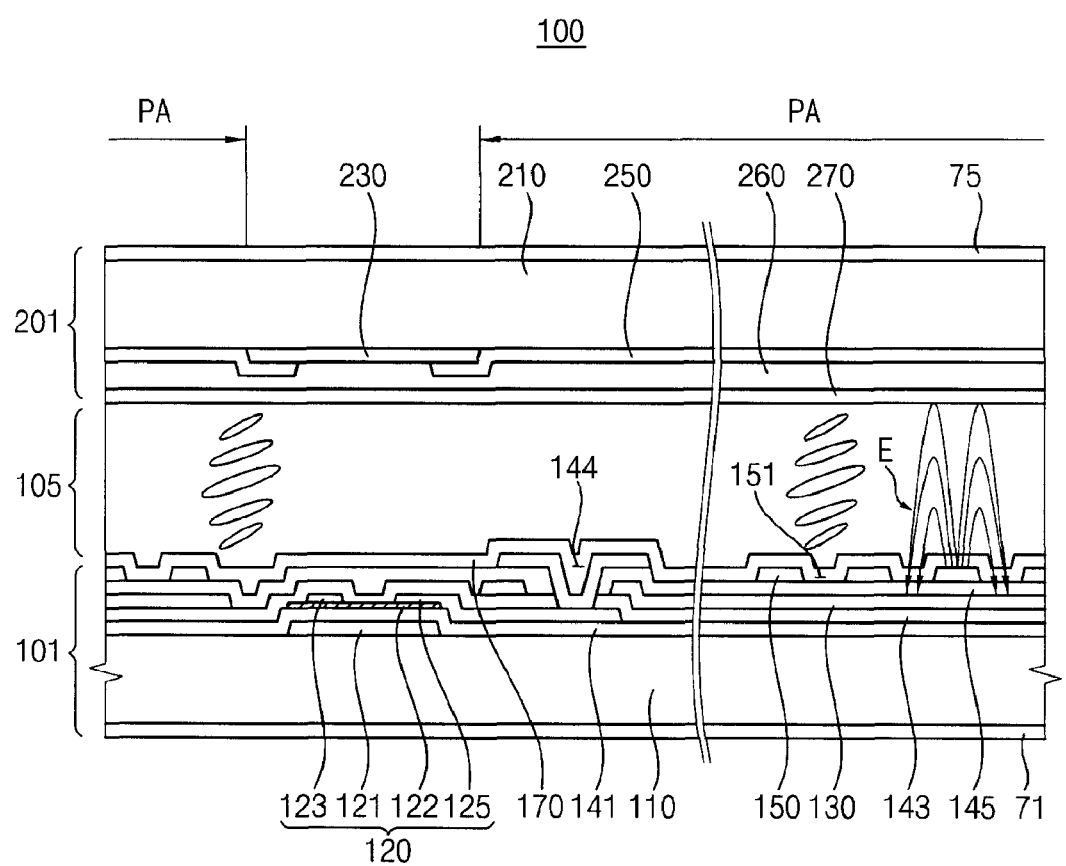
FIG. 3 is a cross-sectional view taken along line I-I' in FIG. 2.

Referring to FIG. 1, FIG. 2, and FIG. 3, the array substrate 101 includes a lower substrate 110, a switching element 120, a common electrode 130, and a pixel electrode 150.

The pixel electrode 150 and the common electrode 130 are formed on the array substrate 101 in the LCD apparatus 100, and the LCD apparatus using a fringe-field switching (FFS) method controls the alignment of the liquid crystal molecules by generating a fringe field E in a parallel direction and in a perpendicular direction with respect to the array substrate 101. Therefore, the LCD apparatus 100 has a wide viewing angle.

The array substrate 101 has a substantially rectangular shape. Therefore, a horizontal direction of the array substrate 101 may be referred to as an x direction, and a vertical direction of the array substrate 101 may be referred to as a y direction.

FIG. 2 is an enlarged plan view showing a pixel of the display apparatus in FIG. 1. FIG. 3 is a cross-sectional view taken along line I-I' in FIG. 2.

A plurality of gate lines 111 and data lines 115 are formed on the lower substrate 110, and the data lines 115, which are insulated from the gate lines 111, extend to cross the gate lines 111.

Referring to FIG. 1, the driving part 10 is mounted in the shape of a driver integrated circuit (IC) in a peripheral area 51 of the lower substrate 110 that is not covered by the opposite substrate 201. Thus, the same reference numeral is used for both the driver IC 10 and the driving part 10. A flexible printed circuit (FPC) 30 is connected to an edge of the peripheral area 51.

An input terminal of the driver IC 10 is connected to the FPC 30 by an external connection line 35.

Figure 4A:
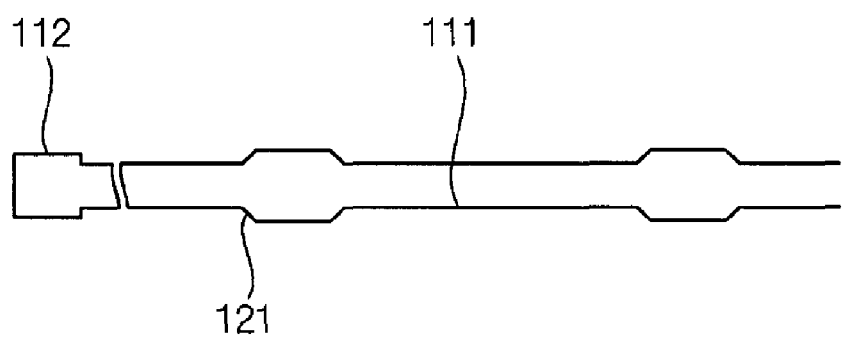
FIG. 4A, FIG. 4B, and FIG. 4C are plan views showing a method of manufacturing the array substrate in FIG. 1, FIG. 2, and FIG. 3.
Figure 4A:
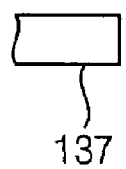
Figure 4A:
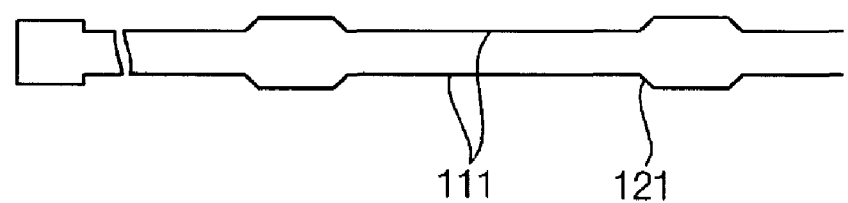
Figure 4B:
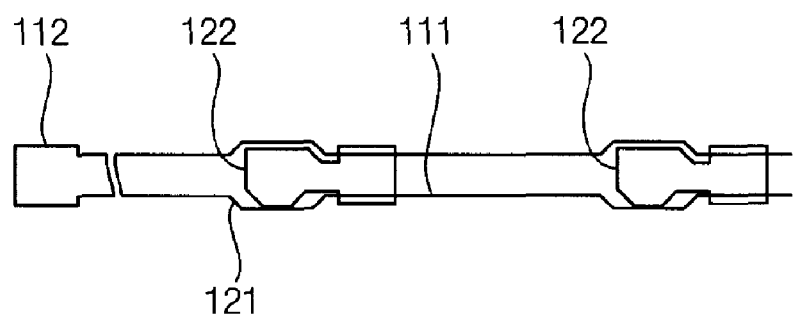
Figure 4B:
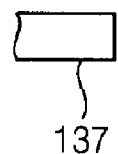
Figure 4B:
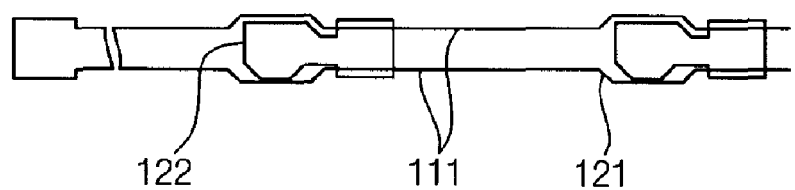
Figure 4C:
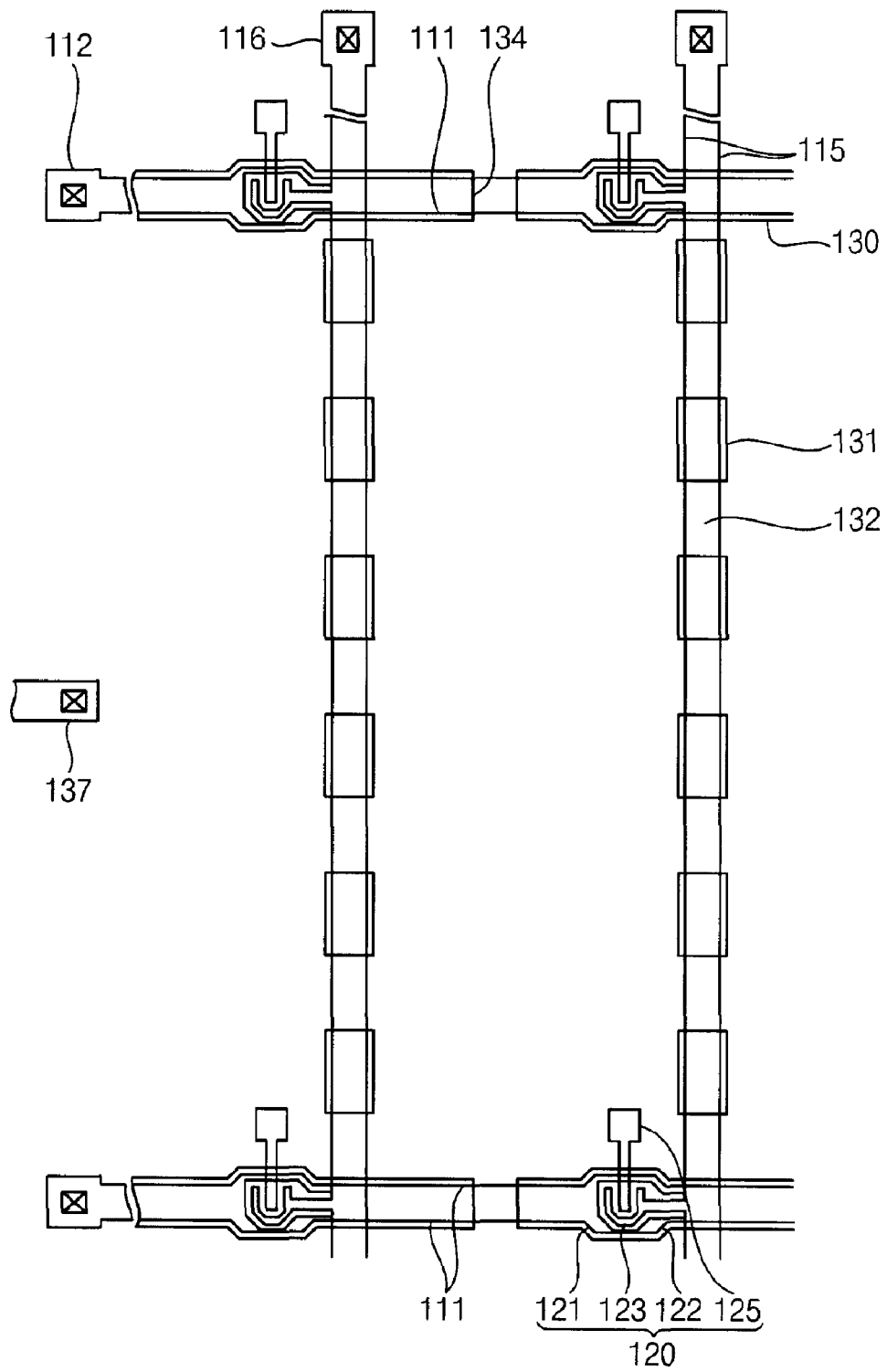

FIG. 4A, FIG. 4B, and FIG. 4C are plan views showing a method of manufacturing the array substrate in FIG. 1, FIG. 2, and FIG. 3.

Referring to FIG. 1, FIG. 2, FIG. 3, FIG. 4A, FIG. 4B, and FIG. 4C, a conductive layer is deposited by a sputtering process on the lower substrate 110, which may be made of glass or plastic, to manufacture the array substrate 10. A plurality of gate lines 111, a gate electrode 121, a gate pad 112, and a common signal line 137 are formed to extend in the x direction by patterning of photo-etching process using a mask.

Each gate line 111 may have a three-layer structure including titanium, aluminum, and titanium, and one end of the gate line 111 is connected to an output terminal of the driver IC 10. The gate electrode 121 is formed protruding in a line width direction from the gate line 111.

The gate lines 111 may include a first line 113 and a second line 114. The first line 113 extends in the y direction from outside of a display area DA displaying an image, and the second line 114 disposed in the display area DA extends in the x direction from the first line 113.

The display area DA includes the pixel area PA, which is a unit cell for controlling the liquid crystal layer 105, and is defined as an image display area having a smaller area than the opposite substrate 201. The pixel electrode 150 is disposed in the pixel area PA, and the pixel area PA is defined as an individual area unit where the liquid crystal layer 105 is independently controlled.

The array substrate 101 further includes a gate insulation layer 141, a first insulation layer 143, a second insulation layer 145, and a first alignment layer 170.

After the gate lines 111 are formed, a three-layer film is continuously laminated. The three-layer film includes the gate insulation layer 141 having a thickness of about 1,500 Å to 5,000 Å, an intrinsic amorphous silicon layer having a thickness of about 500 Å to 2,000 Å, and an extrinsic amorphous silicon layer having a thickness of about 300 Å to 600 Å.

The gate insulation layer 141 may include an insulating material such as silicon nitride or silicon oxide. The gate insulation layer 141 is formed in the display area DA of the lower substrate 110 in which the gate lines 111 are formed, and insulates the gate lines 111 and the data lines 115.

By patterning the extrinsic amorphous silicon layer and the intrinsic amorphous silicon layer using a photo-etching process, referring to FIG. 4B, a channel layer 122 is formed on the gate insulation layer 141. The channel layer 122 includes the extrinsic amorphous silicon layer and the intrinsic amorphous silicon layer, which are patterned as an island shape.

Referring to FIG. 4C, a conductive layer is deposited to a thickness of about 1,500 Å to 5,000 Å on the gate insulation layer 141 by a sputtering process, and patterned by a dry or wet etching process, thereby forming a plurality of data lines 115, a source electrode 123, a drain electrode 125, and a data pad 116 that extend in the y direction.

The data lines 115 are insulated from the gate lines 111, extend in the y direction, and cross the second line 114 of the gate lines 111. The data lines 115 are separated from each other at discrete intervals along the x direction. One end of each data line 115 is connected to the output terminal of a driver IC 10.

The source electrode 123 is disposed on the channel layer 122 protruding in the x direction from the data lines 115. The drain electrode 125 is formed on the gate insulation layer 141 where the data lines 115 and the source electrode 123 are also formed, and one end of the drain electrode 125 is disposed to face the source electrode 123 on the channel layer 122.

A portion of the extrinsic amorphous silicon layer, which is not covered with the data lines 115 and the drain electrode 125, is removed, and the intrinsic amorphous silicon layer, which is disposed below the extrinsic amorphous silicon layer, is exposed. An oxygen plasma process may be used to stabilize an exposed surface of the intrinsic amorphous silicon.

The switching element 120 is formed by the above-mentioned process. The switching element 120 may include the gate electrode 121, the channel layer 122, the source electrode 123, and the drain electrode 125. Therefore, the switching element 120 is formed near the crossing area in which a gate line 111 and a data line 115 cross each other.

A gate control signal is applied to the gate electrode 121 through a gate line 111, and a data signal, which is applied to the source electrode 123 through a data line 115, is applied to the drain electrode 125.

Referring to FIG. 2 and FIG. 3, the first insulation layer 143 is deposited on a surface of the display area DA where the data lines 115 are formed. The first insulation layer 143 includes an inorganic material, such as the material used for the gate insulation layer 141, and is formed to a thickness of about 2,000 Å to 4,000 Å. A contact hole 144, which exposes a part of the drain electrode 125, is formed in the first insulation layer 143.

A contact hole is also formed in the first insulation layer 143 and the gate insulation layer 141 to expose the gate pad 112, and a contact hole is also formed in the first insulation layer 143 to expose the data pad 116.

Figure 5:
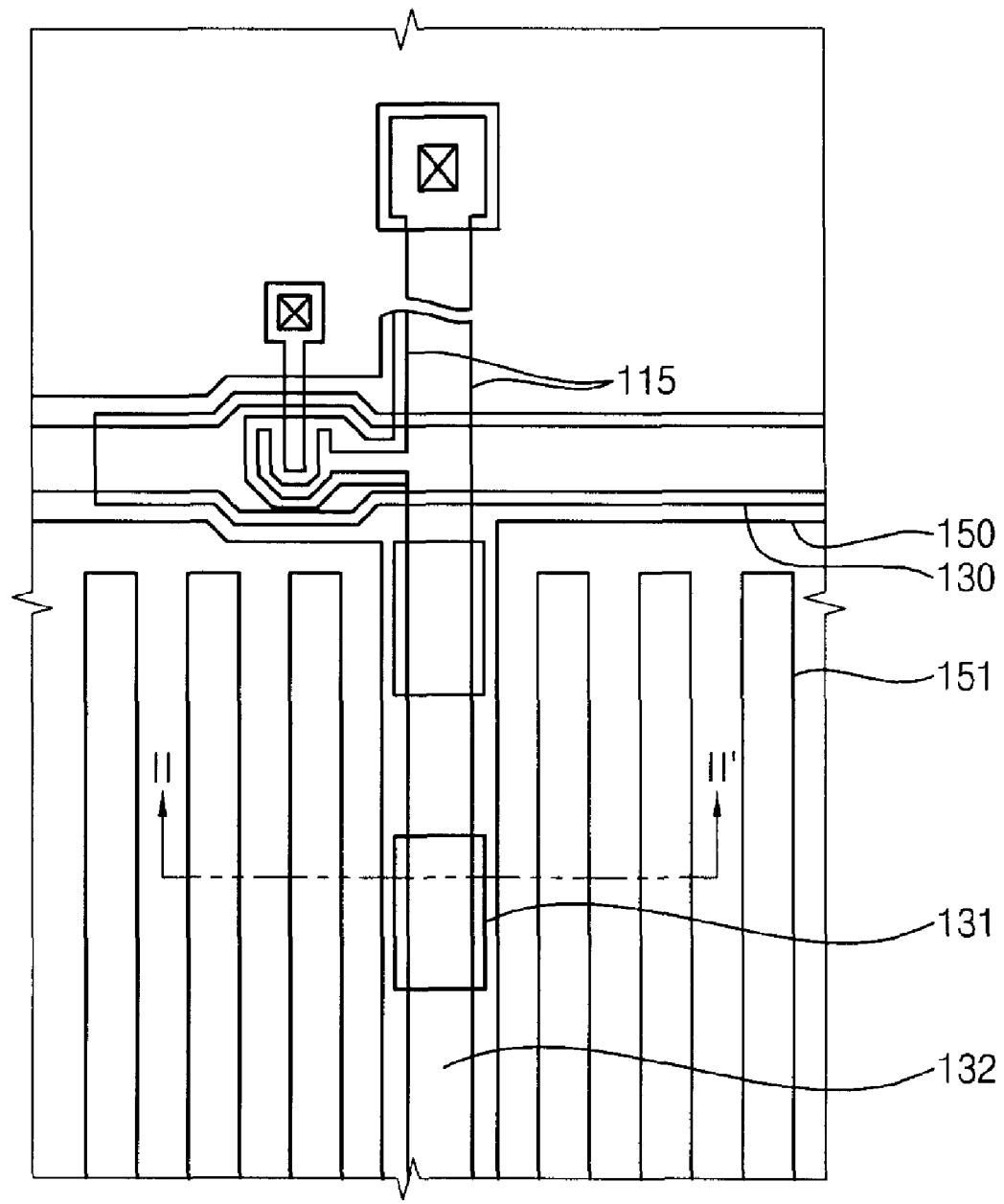
FIG. 5 is an enlarged plan view showing a first slit of a common electrode in FIG. 2.
Figure 6:
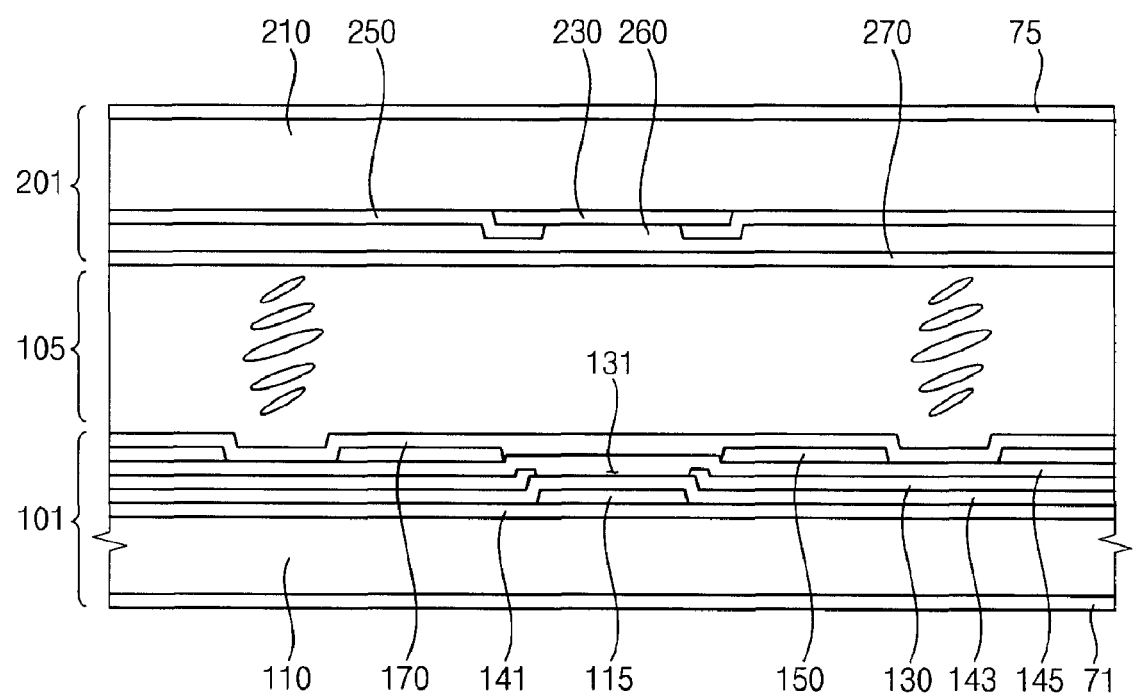
FIG. 6 is a cross-sectional view taken along line II-II' in FIG. 5.

FIG. 5 is an enlarged plan view showing a first slit 131 of a common electrode 130 in FIG. 2. FIG. 6 is a cross-sectional view taken along a line II-II' in FIG. 5.

Referring to FIG. 4C and FIG. 5, a transparent conductive material, such as indium tin oxide (ITO) or indium zinc oxide (IZO), is deposited on the first insulation layer 143. The common electrode 130 is formed by etching in a photo-etching process using a mask. The common electrode 130 may be formed on substantially the entire display area DA of the lower substrate 110 in which the data line 115 is formed.

A plurality of the first slits 131 are formed in the common electrode 130 above the data lines 115. Slits 134 may be formed in the common electrode 130 above the gate lines 111.

The line width of each data line 115 may be about 4.5 μm to 6.0 μm. In FIG. 6, the first slits 131 may be slightly wider than, similar to, or slightly narrower than the line width of the data lines 115. The first slits 131 are aligned in the direction in which the data lines 115 extend.

The mask used in a photo-etching process to form the first slits 131 may have a light-transmitting part or light-blocking part corresponding to the first slits 131. Alternatively, a laser exposure process, which has a higher resolution than the process using the mask, may be used.

The common electrode 130, which extends through the contact hole formed above the common signal line 137, is connected to the common signal line 137. The common signal line 137 is connected to a COM terminal of the driver IC 10. The driver IC is connected to the data pads 116 through the contact holes exposing the data pads 116.

The data line 115 and the common electrode 130, which is disposed directly above the data line 115, may form a parasitic capacitance, and the parasitic capacitance may distort the data signal applied to the data line 115, and increase the power consumption of the driver IC 10.

The first slits 131 are formed in the common electrode 130 above the data lines 115 in the LCD apparatus 100 of the present invention. Therefore, the parasitic capacitance may be greatly reduced by removing portions of the common electrode 130 that are located directly above the data lines 115.

Referring to FIG. 2, the first slits 131 are formed periodically in the y direction, and the common electrode 130 between the first slits 131 is a connection bridge 132 connecting the common electrodes 130 disposed in the pixel area PA with each other.

The connection bridge 132 prevents electric lines of force from being formed between the pixel electrode 150 and the data lines 115 to prevent distortion of the data signal.

The opening extent of the common electrode 130 disposed above the data lines 115 may be selected by controlling the number of the first slits 131 and the length of the data lines 115 in the extension direction.

Referring to FIG. 3, FIG. 4, FIG. 5, and FIG. 6, the second insulation layer 145, which includes the same material as the first insulation layer 143, is formed on the lower substrate 110 where the common electrode 130 is formed, and the contact hole 144 exposing a part of the drain electrode 125 is formed in the first insulation layer 143 and the second insulation layer 145. The second insulation layer 145 may be formed entirely in the display area DA where the common electrode 130 is formed.

The first insulation layer 143 and the second insulation layer 145 are an inorganic layer having a thickness of about 2,000 Å to 4,000 Å, and have a smaller thickness than an organic layer having a thickness of about 3 μm to 4 μm, and thus may simplify a manufacturing process of the present invention.

Referring to FIG. 3, FIG. 4, FIG. 5, and FIG. 6, the transparent conductive material such as indium tin oxide (ITO) or indium zinc oxide (IZO) is deposited on the second insulation layer 145 substantially identically with the common electrode 130, and the pixel electrode 150 is formed in the pixel area PA by etching in a photo-etching process using a mask. The pixel electrode 150 is connected to the drain electrode 125 through the contact hole 144 formed in the first insulation layer 143 and the second insulation layer 145.

Referring to FIG. 2, FIG. 5, and FIG. 6, the common electrode 130 is formed so as not to be overlapped with the data lines 115 and the gate lines 111.

Referring to FIG. 2, FIG. 3, and FIG. 6, a plurality of the second slits 151 are formed in the pixel electrode 150. The second slits 151 extend substantially parallel with the direction in which the data lines 115 extend. Alternatively, the second slits 151 may extend at an angle of about 45 degrees with respect to the gate lines 111.

Referring to FIG. 3, an electric field, which is referred to as a fringe field E, is formed between the pixel electrode 150 and the common electrode 130 because of the second slits 151. When voltages having different polarities are applied to the pixel electrode 150 and the common electrode 130, respectively, electric lines of force are formed in the common electrode 130 from the pixel electrode 150 through the second slits 151. The electric lines of force have horizontal components that are substantially parallel with the array substrate 101, and have vertical components that are substantially perpendicular to the array substrate 101.

Referring to FIG. 3 and FIG. 6, the first alignment layer 170 including a polyimide is formed on the substrate where the pixel electrode 150 is formed. The first alignment layer 170 is formed in the entire area of the display area DA where the pixel electrode 150 is formed. The first alignment layer 170 initially aligns the liquid crystal layer 105.

The opposite substrate 201 may include an upper substrate 210, a light-blocking pattern 230, a color filter 250, an overcoating layer 260, and a second alignment layer 270.

The upper substrate 210 faces the lower substrate 110, and may be formed from the same material of the lower substrate 110, such as glass or plastic.

The light-blocking pattern 230 is formed on the upper substrate 210 corresponding to the switching element 120, the gate line 111, and the data line 115. The light-blocking pattern 230 includes a metallic material, including an organic material or chromium.

The color filter 250 divided by the light-blocking pattern 230 is disposed on the upper substrate 210 corresponding to the pixel area PA. The color filter 250 may be a red, green, or blue color filter.

The overcoating layer 260 covers the color filter 250 and the light-blocking pattern 230, to planarize the color filter 250 and the light-blocking pattern 230.

The second alignment layer 270 is formed on the overcoating layer 260.

As a general rule, increasing the aperture ratio of the pixel area PA is desirable. As the control area related to the liquid crystal increases, the aperture ratio increases. The fringe field E is formed in the area between the pixel electrode 150 and the common electrode 130 at the edge of the pixel area PA to increase the aperture ratio of the pixel area PA. Therefore, the common electrode 130 is formed above the data lines 115 to increase the aperture ratio.

As previously described, the common electrode 130 above the data lines 115 may increase the parasitic capacitance, and crosstalk and current consumption may increase.

A plurality of the first slits 131 are formed in the common electrode 130 above the data lines 115. Therefore, the common electrode 130 above the data lines 115 is not completely exposed, and is not completely overlapped with the data lines 115, and thus the common electrode 130 is a bit of both. Reducing the parasitic capacitance between the data lines 115 and the common electrode 130 may prevent crosstalk, reduce the consumption current, and enhance the aperture ratio.

An appropriate point of compromise may be found between the enhancement of aperture ratio and the reduction of parasitic capacitance by controlling the number and line widths of the first slits 131.

Figure 7A:
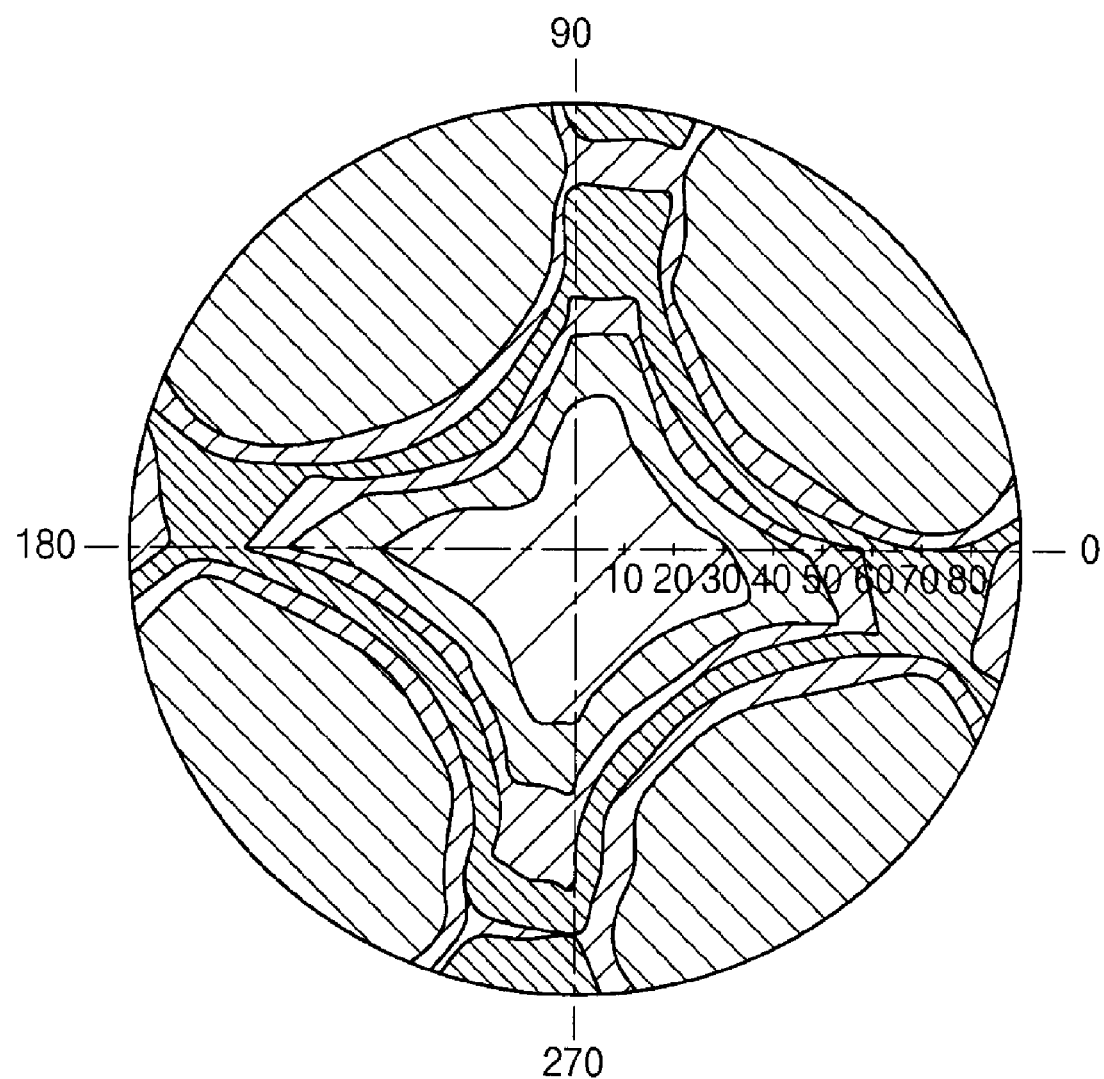
FIG. 7A is a graph showing light leakage through a side of the display apparatus where a slit of the common electrode is not formed.
Figure 7B:
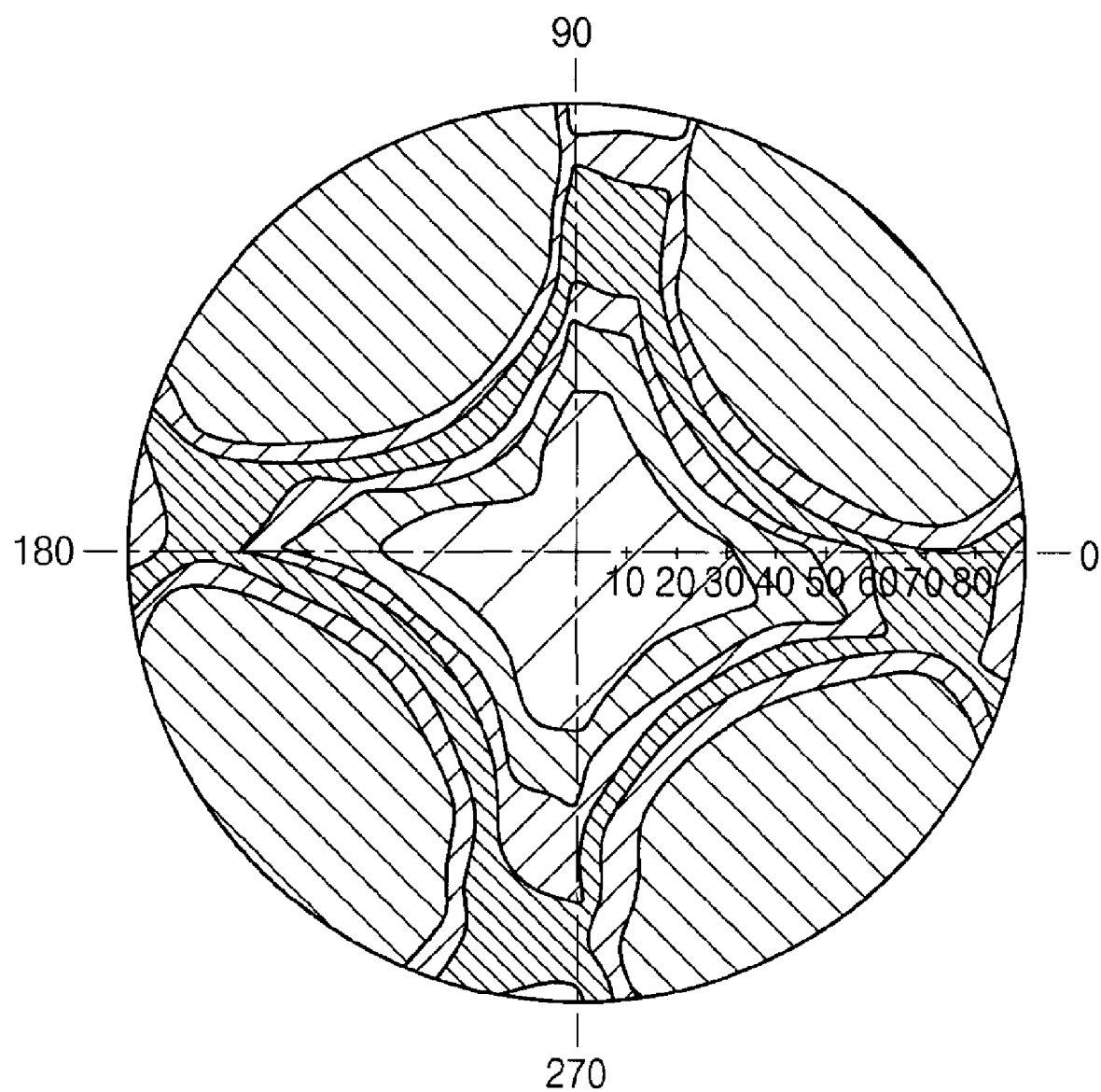
FIG. 7B is a graph showing light leakage through a side of the display apparatus in accordance with a first exemplary embodiment of the present invention.

Although the fringe field E may be formed between edges of the common electrode 130 formed by the first slits 131 and the data lines 115, there may be almost no light leakage increase and almost no reduction of a light transmission ratio. Referring to FIG. 7A and FIG. 7B, illustrations of there being almost no light leakage increase and almost no reduction of a light transmission ratio are provided.

FIG. 7A is a graph showing light leakage through a side of the LCD apparatus where a slit of the common electrode 130 is not formed. FIG. 7B is a graph showing light leakage through a side of the LCD apparatus 100 in accordance with a first exemplary embodiment of the present invention.

Referring to FIG. 7A and FIG. 7B, viewing directions of the display panel are marked as angles along the circumference of a circle graph. As the distance from the center of the circle increases in a radial direction, the viewing angle from the normal line of the display panel increases. Additionally, a contour line connects positions having the same brightness, and the brightness is reduced as the distance increases from the center of the circle.

The simulation results of FIG. 7A and FIG. 7B are obtained by simulating a black state of the display panel by maintaining the display panel in a black state and increasing the viewing angle.

In the display panel driven by the FFS method, the LCD apparatus having the common electrode 130 without a slit in an area above the data lines 115 as shown in FIG. 7A is compared with the LCD apparatus having the common electrode 130 having a slit in an area above the data lines 115 in FIG. 7B. In FIG. 7A and FIG. 7B, the viewing angle characteristics are similar regardless of the variation of the viewing angle or the luminance of the black image. The luminance of the black image increases as the viewing angle increases.

Also, the brightness characteristics may be nearly the same at the same position.

That is, although the first slits 131 are formed in the common electrode 130, the light leakage may not increase, and the transmission ratio may not be reduced.

Figure 8:
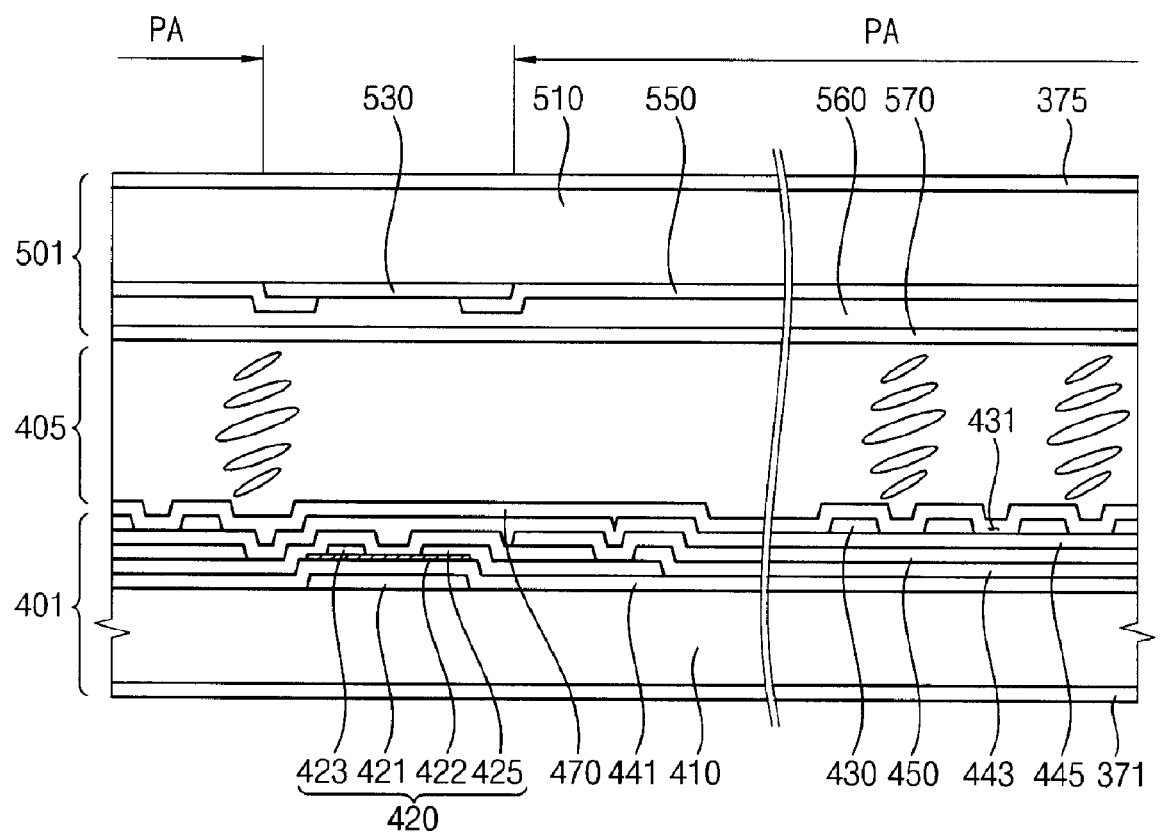
FIG. 8 is a cross-sectional view showing a switching element of a display apparatus in accordance with a second exemplary embodiment of the present invention.
Figure 9:
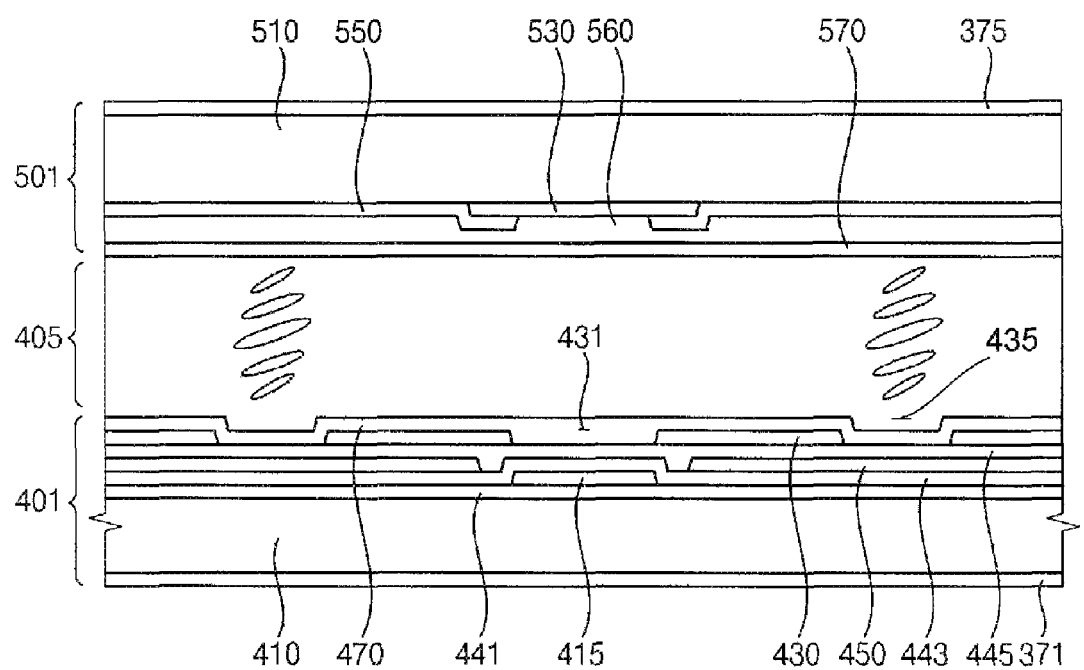
FIG. 9 is a cross-sectional view showing a slit formed in a common electrode above a data line of the display apparatus in FIG. 8.

FIG. 8 is a cross-sectional view showing the structure of a switching element 420 of an LCD apparatus 400 in accordance with a second exemplary embodiment of the present invention. FIG. 9 is a cross-sectional view showing a slit formed in a common electrode 430 above the data line 415 at the LCD apparatus 400 in FIG. 8.

Referring to FIG. 8 and FIG. 9, an array substrate 401 is substantially the same as the array substrate 101 described in FIG. 1, FIG. 2, FIG. 3, FIG. 4, and FIG. 5 except that the common electrode 430 is disposed above the pixel electrode 450, a second slit 435 is omitted in the pixel electrode 450, and the second slit 435 is formed in the common electrode 430. Thus, the same reference numerals are used for the same elements and the repeated descriptions will be omitted.

Also, a manufacturing method of the array substrate 401 is substantially the same as the manufacturing method of the array substrate 101 described in FIG. 4A, FIG. 4B, and FIG. 4C except that the pixel electrode 450 is formed before the common electrode 430 is formed. Thus, the same reference numerals are used for the same elements and the repeated descriptions will be omitted.

The contact hole exposing a part of a drain electrode 425 of the switching element 420 is formed on a first insulation layer 443, a transparent conductive material is disposed in the pixel area PA of the first insulation layer 443, and the pixel electrode 450 is formed by a photo-etching process. The pixel electrode 450 is connected to the drain electrode 425 through the contact hole. A slit is not formed in the pixel electrode 450, and a surface shape is formed.

The second insulation layer 445 is formed of an inorganic material on the pixel electrode 450.

The common electrode 430 may be formed of the same material as the pixel electrode 450 on the second insulation layer 445 corresponding to the display area DA.

First slits 431 are formed directly above the data line 415 in the common electrode 430. A plurality of the first slits 431 may be periodically formed in the extending direction of the data line 415. The first slits 431 are formed between edges of the pixel electrode 450 and edges of adjacent pixel electrodes 450. A plurality of second slits 435 are formed in the common electrode 430 disposed in the pixel area PA in parallel with the data line 415. The shape of the second slits 435 is the same as that of the second slits 151.

A first alignment layer 470 is formed on the common electrode 430.

The LCD apparatus 400 includes a display panel and a driver.

Referring to FIG. 8 and FIG. 9, the LCD apparatus 400 is substantially the same as the LCD apparatus 100 described in FIG. 1, FIG. 2, FIG. 3, FIG. 4, and FIG. 5 except that the LCD apparatus 400 includes the array substrate 401. Thus, the same reference numerals are used for the same elements and the repeated descriptions will be omitted. According to the present exemplary embodiment, a gap interval between the common electrode 430 and the data line 415 is increased compared to the previous example embodiment. Therefore, the vertical parasitic capacitance between the common electrode 430 and the data line 415 may be reduced.

Figure 10:
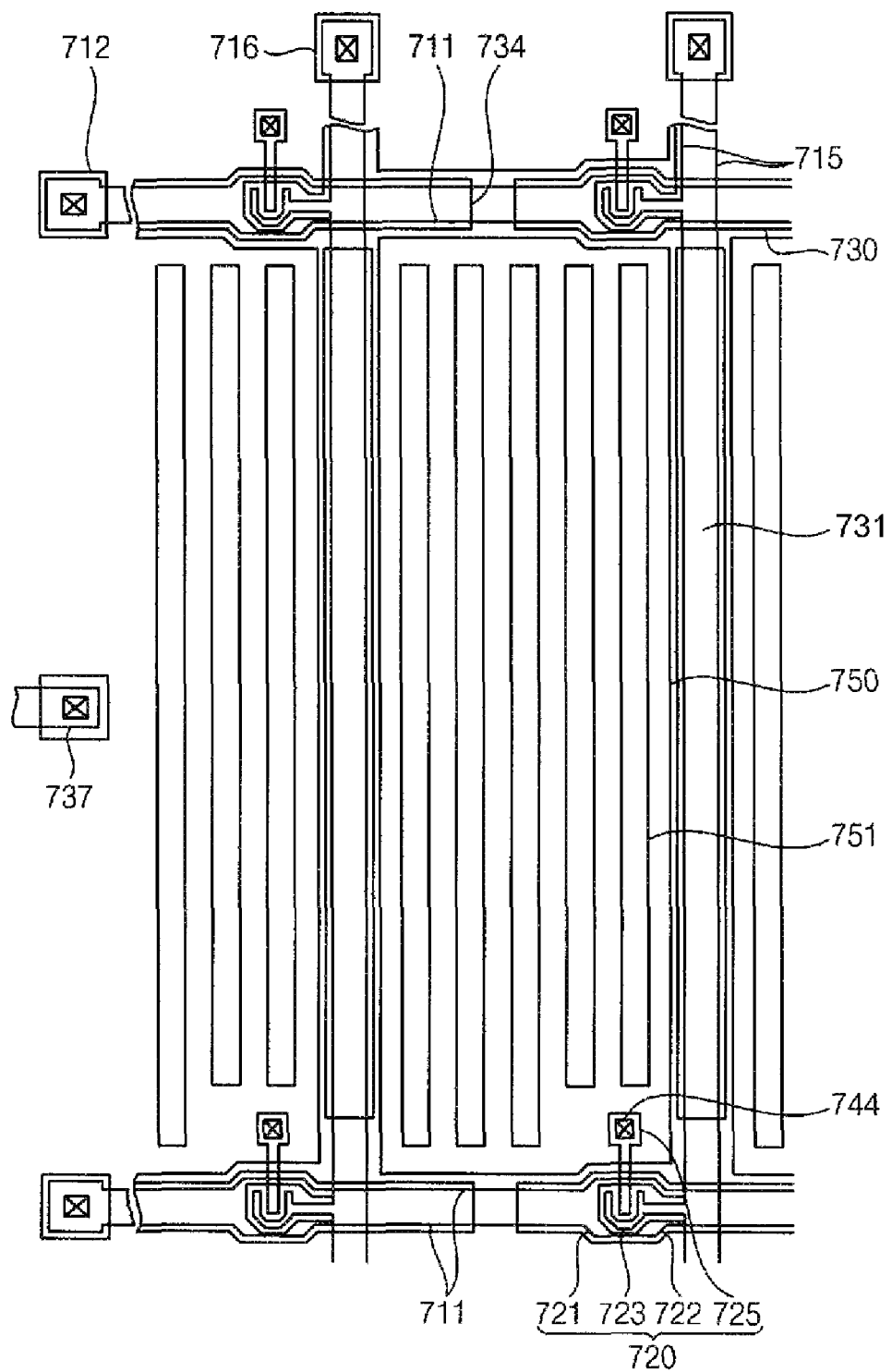
FIG. 10 is an enlarged plan view showing a display apparatus in accordance with a third exemplary embodiment of the present invention.

FIG. 10 is an enlarged plan view showing an array substrate 701 of a display apparatus in accordance with a third exemplary embodiment of the present invention.

Referring to FIG. 10, the array substrate 701 and a manufacturing method of the same are substantially the same as the array substrate 101 described in FIG. 1, FIG. 2, FIG. 3, FIG. 4, and FIG. 5 and the manufacturing method of an array substrate in FIG. 4A, FIG. 4B, and FIG. 4C, respectively, except that a first slit 731 formed in a common electrode 730 is formed corresponding to one pixel area having a similar width to the line width of the data lines 715. Thus, the same reference numerals are used for the same elements and the repeated descriptions will be omitted.

In the array substrate 701 and a manufacturing method of the same, the first slit 731 is formed in the common electrode 730 directly above the data lines 715. The first slit 731 is extended in the longitudinal data lines 715, and is formed periodically. The first slit 731 is formed above the data lines 715 corresponding to the pixel area, and may be formed to have a similar line width as the line width of the data lines 715.

The LCD apparatus of the present example embodiment includes a display panel and a driver.

The LCD apparatus is substantially the same as the LCD apparatus 100 described in FIG. 1, FIG. 2, FIG. 3, FIG. 4, and FIG. 5 except that the LCD apparatus has the array substrate 701 in FIG. 10. Thus, the same reference numerals are used for the same elements and the repeated descriptions will be omitted.

Although the common electrode 730 is arranged close to the data lines 715, the vertical parasitic capacitance may be reduced compared to the previous example embodiment by completely opening the common electrode 730 directly above the data lines 715.

According to exemplary embodiments of the present invention, defects such as crosstalk may be decreased, and power consumption may be reduced. An aperture ratio may be increased. Therefore, exemplary embodiments of the present invention may be applied in various fields to enhance the image quality of an LCD apparatus.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An array substrate, comprising:
    a substrate comprising a plurality of gate lines and a plurality of data lines insulated from the gate lines, the data lines extending in a first direction crossing the gate lines;
    a switching element connected to a first gate line and a first data line;
    a first insulation layer covering the data lines and the switching element;
    a pixel electrode arranged in a pixel area, and connected to an output electrode of the switching element and arranged on the first insulation layer;
    a common electrode corresponding to the pixel area and insulated from the pixel electrode, the common electrode having at least one first slit corresponding to the data line; and a second insulation layer arranged between the pixel electrode and the common electrode,
wherein the common electrode and the pixel electrode comprise portions that are directly overlapping.

2. The array substrate of claim 1, wherein the at least one first slit is arranged between edges of the pixel electrode and edges of an adjacent pixel electrode, and a plurality of first slits is aligned in a first direction.

3. The array substrate of claim 2, wherein the pixel electrode is arranged on the common electrode, the pixel electrode having a plurality of second slits exposing portions of the common electrode.

4. The array substrate of claim 3, wherein
the first insulation layer has a first contact hole exposing a portion of the output electrode, and
the second insulation layer has a second contact hole connected to the first contact hole.

5. The array substrate of claim 4, wherein each of the first insulation layer and the second insulation layer comprises an inorganic material.

6. The array substrate of claim 2, wherein the common electrode is disposed on the pixel electrode, the common electrode having a plurality of second slits exposing portions of the pixel electrode.

7. The array substrate of claim 6,
wherein the first insulation layer has a contact hole exposing a portion of the output electrode.

8. The array substrate of claim 1, wherein the at least one first slit is arranged between edges of the pixel electrode and edges of an adjacent pixel electrode, the at least one first slit being arranged periodically in a direction that the data lines extend.

9. The array substrate of claim 1, wherein the common electrode arranged in the pixel area is connected to a common electrode arranged in an adjacent pixel area.

10. A liquid crystal display (LCD) apparatus, comprising:
an array substrate comprising:
a lower substrate on which gate lines and data lines are arranged, the data lines being insulated from the gate lines and extending in a first direction crossing the gate lines;
a switching element connected to a first gate line and a first data line;
a first insulation layer covering the data lines and the switching element;
a pixel electrode connected to an output electrode of the switching element, the pixel electrode being in a pixel area defined on the lower substrate and arranged on the first insulation layer;
a common electrode corresponding to the pixel area of the lower substrate, the common electrode having at least one first slit aligned in the first direction;
a second insulation layer arranged between the pixel electrode and the common electrode;
an opposite substrate; and
a liquid crystal layer interposed between the array substrate and the opposite substrate,
wherein the common electrode and the pixel electrode comprise portions that are directly overlapping.

11. The LCD apparatus of claim 10, wherein the data lines are disposed between edges of the pixel electrode and edges of an adjacent pixel electrode, and the at least one first slit has a smaller width than gaps between the edges of the pixel electrode and the edges of the adjacent pixel electrode.

12. The LCD apparatus of claim 11, wherein the pixel electrode is arranged on the common electrode, the pixel electrode having a plurality of second slits exposing portions of the common electrode.

13. The LCD apparatus of claim 12, wherein
the first insulation layer has a first contact hole exposing a portion of the output electrode, and
the second insulation layer has a second contact hole connected to the first contact hole, and
the array substrate further comprises a first alignment layer on the pixel electrode and the second insulation layer.

14. The LCD apparatus of claim 13, wherein the first insulation layer and the second insulation layer each have a thickness of 2,000 Å to 4,000 Å, and each comprise an inorganic material.

15. The LCD apparatus of claim 13, wherein the opposite substrate comprises:
an upper substrate;
a light-blocking pattern arranged on the upper substrate at locations corresponding to the switching element, the gate lines, and the data lines;
a color filter arranged in the pixel area of the upper substrate, the color filter being arranged into at least two sections by the light-blocking pattern; and
a second alignment layer arranged on the color filter and the light-blocking pattern.

16. The LCD apparatus of claim 11, wherein the common electrode is arranged on the pixel electrode, the common electrode having a plurality of second slits exposing portions of the pixel electrode.

17. The LCD apparatus of claim 10, further comprising:
a driver to control the liquid crystal layer in a fringe-field switching (FFS) method using an electric field generated between the pixel electrode and the common electrode through second slits, the second slits being arranged through the common electrode or the pixel electrode.

18. The LCD apparatus of claim 17, wherein the second slits are arranged through an upper electrode among the common electrode and the pixel electrode with respect to the lower substrate.

19. The LCD apparatus of claim 18, wherein
the first insulation layer is arranged between the data lines and a lower electrode among the common electrode and the pixel electrode, and
the array substrate further comprises a first alignment layer arranged on the second insulation layer.

20. The LCD apparatus of claim 18, wherein a plurality of the first slits are periodically arranged in the first direction, and the second slits are arranged substantially parallel to the data lines.

21. The LCD apparatus of claim 17, wherein the driver is disposed on an outer portion of the array substrate, which is not overlapped with the opposite substrate, to receive a panel driving signal that is externally provided to generate a pixel voltage.

22. The array substrate of claim 1, wherein the at least one first slit exposes an entire width of the data line.

23. The LCD apparatus of claim 10, wherein the at least one first slit exposes an entire width of the data line.

* * * * *